US 12,467,475 B2

(12) United States Patent
Xu

(10) Patent No.: US 12,467,475 B2
(45) Date of Patent: Nov. 11, 2025

(54) LIGHT EMITTING FAN

(71) Applicant: Purple Cloud Development Pte. Ltd., Singapore (SG)

(72) Inventor: Shiman Xu, Hui Zhou (CN)

(73) Assignee: Purple Cloud Development Pte. Ltd., Singapore (SG)

( * ) Notice: Subject to any disclaimer, the term of this patent is extended or adjusted under 35 U.S.C. 154(b) by 0 days.

(21) Appl. No.: 18/607,461

(22) Filed: Mar. 16, 2024

(65) Prior Publication Data
US 2024/0318665 A1  Sep. 26, 2024

(30) Foreign Application Priority Data

Mar. 23, 2023 (CN) .......................... 202310294930.1

(51) Int. Cl.
*F21V 33/00* (2006.01)
*F04D 19/00* (2006.01)
*F04D 29/00* (2006.01)
*F04D 29/52* (2006.01)
*F04D 29/64* (2006.01)
(Continued)

(52) U.S. Cl.
CPC ......... *F04D 29/526* (2013.01); *F04D 19/002* (2013.01); *F04D 29/005* (2013.01); *F04D 29/522* (2013.01); *F04D 29/646* (2013.01); *F21V 33/0096* (2013.01); *F01D 25/08* (2013.01); *F04D 25/0613* (2013.01); *F21Y 2115/10* (2016.08)

(58) Field of Classification Search
CPC .... F04D 29/522; F04D 29/526; F04D 29/646; F04D 29/005; F04D 19/002; F04D 19/007; F04D 25/0613; F04D 25/08; F21V 33/0096
See application file for complete search history.

(56) References Cited

U.S. PATENT DOCUMENTS 9,506,663 B2 * 11/2016 Lin .......................... F24F 3/056
9,777,918 B1 * 10/2017 Wen ...................... F21V 19/003
(Continued)

FOREIGN PATENT DOCUMENTS

CN      209212606 U  *  8/2019

OTHER PUBLICATIONS

CN-209212606—translation from Espacenet (Year: 2019).*

*Primary Examiner* — Courtney D Heinle
*Assistant Examiner* — Behnoush Haghighian
(74) *Attorney, Agent, or Firm* — MERCHANT & GOULD P.C.

(57) ABSTRACT

A light emitting fan including a first light guide, light source component, chassis, second light guide, plurality of blades rotatably mounted to the chassis, cover, and at least one fastening assemblage is provided. The first light guide has a plurality of different first light emitting surfaces. The second light guide has a plurality of different second light emitting surfaces. The at least one fastening assemblage comprises a first cavity structure, a second cavity structure, and a pair of arms. The first cavity structure is integrated with the cover, the second cavity structure is integrated with the chassis, and the pair of arms is integrated with the first light guide. The at least one fastening assemblage removably interlocks the cover and light source component with the first light guide and removably interlocks the chassis and second light guide with the first light guide.

18 Claims, 8 Drawing Sheets

(51) Int. Cl.
   *F01D 25/08*    (2006.01)
   *F04D 25/06*    (2006.01)
   *F21Y 115/10*   (2016.01)

(56) References Cited

U.S. PATENT DOCUMENTS

| | | | | |
|---|---|---|---|---|
| 10,237,943 | B2* | 3/2019 | Lin | F04D 25/0613 |
| 10,711,992 | B2* | 7/2020 | Fan | H05K 7/20172 |
| 10,900,493 | B2* | 1/2021 | Huang | F04D 29/005 |
| 10,927,842 | B2* | 2/2021 | Lin | F04D 29/646 |
| 10,989,405 | B2* | 4/2021 | Fan | G06F 1/181 |
| 11,118,603 | B2* | 9/2021 | Xu | F21V 33/0096 |
| 11,280,489 | B2* | 3/2022 | Fan | G06F 1/181 |
| 11,326,771 | B2* | 5/2022 | Xu | F21V 33/0096 |
| 11,686,467 | B1* | 6/2023 | Yuan | F04D 25/166 |
| | | | | 362/96 |
| 2016/0154164 | A1* | 6/2016 | Lin | F24F 3/056 |
| | | | | 362/96 |
| 2018/0017725 | A1* | 1/2018 | Fang | F21V 19/003 |
| 2018/0163960 | A1* | 6/2018 | Lin | F04D 25/0613 |
| 2019/0029143 | A1* | 1/2019 | Xie | F04D 25/0613 |
| 2019/0249862 | A1* | 8/2019 | Fan | F21V 17/12 |
| 2019/0316769 | A1* | 10/2019 | Fan | F21V 3/02 |
| 2019/0346130 | A1* | 11/2019 | Lin | H05K 1/0284 |
| 2020/0032807 | A1* | 1/2020 | Lin | F21V 33/0096 |
| 2020/0240425 | A1* | 7/2020 | Huang | H05K 7/20172 |
| 2021/0199128 | A1* | 7/2021 | Xu | F04D 29/601 |
| 2021/0207796 | A1* | 7/2021 | Fan | F04D 25/0613 |
| 2021/0222868 | A1* | 7/2021 | Xu | F04D 29/646 |

* cited by examiner

LIGHT EMITTING FAN

RELATED APPLICATIONS

This US application claims the benefit of priority to China application no. 202310294930.1, filed on Mar. 23, 2023, of which is incorporated herein by reference in its entirety.

TECHNICAL FIELD

The present disclosure is related to fans in general and more particularly but not limited to light emitting fans and frames.

BACKGROUND OF THE INVENTION

LED-colored cooling fans are a type of cooling fan used in electronic systems such as personal computers. LED stands for light-emitting diode and an LED is generally known to be energy-efficient, durable, and versatile. LEDs may be assembled adjacent to or around a frame and in some way illuminate a fan impeller. The cooling fans may be connected to a controller or motherboard allowing a user to adjust a color, brightness, speed, and mode of the LEDs for decorative purposes. The cooling fans may also be connected to sensors that allow the cooling fans to change colors according to a temperature or load of the electronic systems.

Providing a multitude of different light radiation angles and combinations of different aesthetics during operation of cooling fans without increasing a footprint within electronic systems continue to be a challenge. Moreover, as the usage of LEDs in cooling fans increase, so does the need for assembly and disassembly of the cooling fans for assembly, maintenance, repair, or replacement of components. Often, the cooling fans are assembled together by fasteners needing tools, special equipment, or multiple steps which may be inconvenient, inefficient, time-consuming and cumbersome.

SUMMARY OF THE INVENTION

The present disclosure provides a light emitting fan including a first light guide, light source component, chassis, second light guide, plurality of blades rotatably mounted to the chassis, cover, and at least one fastening assemblage. The first light guide has a plurality of different first light emitting surfaces and the second light guide has a plurality of different second light emitting surfaces, thus, providing a multitude of different light radiation angles and combinations of different aesthetics during operation of the light emitting fan. The at least one fastening assemblage removably interlocks the cover and light source component with the first light guide and removably interlocks the chassis and second light guide with the first light guide, thus, providing easy and convenient assembly and disassembly of the light emitting fan without the need for tools, special equipment or multiple steps for assembly, maintenance, repair, or replacement of components.

In at least one embodiment, a light emitting fan includes a first light guide, a light source component, a chassis, a plurality of blades, a cover, and at least one fastening assemblage. The first light guide has a plurality of first light emitting surfaces. The light source component is associated with the first light guide. The light source component and the first light guide at least partially define a cavity. The plurality of blades is rotatably mounted to the chassis. The plurality of first light emitting surfaces is in radiant communication with the cavity and planes of each of the plurality of first light emitting surfaces are substantially different. The at least one fastening assemblage removably interlocks the cover with the first light guide and removably interlocks the chassis with the first light guide. In at least one embodiment, the at least one fastening assemblage includes four at least one fastening assemblages.

In at least one embodiment, the chassis includes a mounting structure and the plurality of blades includes a hub and blades. The mounting structure is centrally within the chassis. A shape of the mounting structure corresponds to a shape of the hub and the hub is rotatably mounted on the mounting structure. In at least one embodiment, the light source component includes a circuit board and a plurality of light emitting diodes. The plurality of light emitting diodes is on and electrically connected to the circuit board and the plurality of light emitting diodes is in communication with the cavity.

In at least one embodiment, the plurality of first light emitting surfaces include a first light emitting first surface, a first light emitting third surface, and a first light emitting fourth surface. The first light emitting fourth surface is substantially parallel to the first light emitting third surface and the first light emitting first surface is between the first light emitting fourth surface and the first light emitting third surface. In at least one embodiment the first light emitting first surface includes a first light emitting first flat surface and a first light emitting first angled surface. The first light emitting first flat surface is substantially perpendicular to the first light emitting third surface and the first light emitting first angled surface is substantially not perpendicular to the first light emitting third surface.

In at least one embodiment, the first light guide further includes a first rim on one end, whereby at least one of the plurality of first light emitting surfaces is defined by the first rim. In at least one embodiment, the first rim includes a first grooved end having a plurality of different first light incident angles. The first grooved end is in communication with the cavity, whereby at least one of the plurality of first light emitting surfaces is in radiant communication with the cavity via the plurality of different first light incident angles.

In at least one embodiment, the at least one fastening assemblage includes a first cavity structure, a second cavity structure, and a pair of arms. The first cavity structure has a first recess, the second cavity structure has a second recess, and each of the pair of arms has a first protrusion on one end and a second protrusion on an opposite end. The first cavity structure is integrated with the cover, the second cavity structure is integrated with the chassis, and the pair of arms is integrated with the first light guide. When the cover is removably interlocked with the first light guide, the first protrusions of each of the pair of arms are interlocked within the first recess to hold the cover to the first light guide. When the chassis is removably interlocked with the first light guide, the second protrusions of each of the pair of arms are interlocked within the second recess to hold the chassis and the light source component to the first light guide.

In at least one embodiment, the at least one fastening assemblage further includes a quick release mechanism having an attached portion and an open end. The attached portion is integrated with the cover, whereby when the cover is removably interlocked with the first light guide, the quick release mechanism encompasses each of the first protrusions and the first recess on an opposite side of each of the first protrusions and the first recess and when the chassis is removably interlocked with the first light guide, the quick release mechanism encompasses each of the second protrusions and the second recess on an opposite side of each of the second protrusions and the second recess. In at least one embodiment, the quick release mechanism further has a U-shape plate shape, whereby when a separation force is placed on two opposing sides of the quick release mechanism in an outward and upward direction, each of the first protrusions is unlocked from the first recess to release the cover from the first light guide.

In at least one embodiment, the pair of arms is spaced apart by a distance. When interlocking and unlocking the cover with the first light guide, surface areas of each of the first protrusions in contact with the first recess are less than the total available contact surface area of the first recess. When interlocking and locking the chassis with the first light guide, surface areas of each of the second protrusions in contact with the second recess are less than the total available contact surface area of the second recess.

In at least one embodiment, the light emitting fan further includes a second light guide. The second light guide includes a second light emitting third surface and a second light emitting second surface. The second light guide is assembled to the chassis and the light source component is assembled on the second light guide. The second light guide, the light source component and the first light guide define the cavity. The second light emitting third surface and the second light emitting second surface are in radiant communication with the cavity. The second light emitting second surface is substantially perpendicular to the second light emitting third surface and the second light emitting second surface is substantially parallel to the first light emitting first flat surface. When the chassis is removably interlocked with the first light guide, the chassis, the second light guide, and the light source component are held to the first light guide.

In at least one embodiment, the second light guide further includes a second grooved end having a plurality of different second light incident angles. The second grooved end is in communication with the cavity, whereby the second light emitting third surface and the second light emitting second surface are in radiant communication with the cavity via the plurality of different second light incident angles. In at least one embodiment, the chassis includes an inner wall and an outer wall. The inner wall is substantially parallel to the outer wall and an inner wall height of the inner wall is greater than an outer wall height of the outer wall. The second light guide and the light source component are assembled at least partially between the inner wall and the outer wall. In at least one embodiment, the chassis further includes a plurality of base structures and the second light guide further includes a plurality of bottom cut-outs. The plurality of base structures is connected to and between the inner wall and the outer wall. The plurality of bottom cut-outs is substantially opposite the second grooved end. A shape of the plurality of bottom cut-outs substantially correspond to a shape of the plurality of base structures, whereby the plurality of bottom cut-outs at least partially encompass the plurality of base structures.

In at least one embodiment a frame includes a first light guide, a chassis, a cover and at least one fastening assemblage. The first light guide has a plurality of first light emitting surfaces. The at least one fastening assemblage removably interlocks the cover with the first light guide and removably interlocks the chassis with the first light guide substantially opposite the cover.

The at least one fastening assemblage of the frame includes a first cavity structure, a second cavity structure, and a pair of arms. The first cavity structure has a first recess, the second cavity structure has a second recess, and each of the pair of arms has a first protrusion on one end and a second protrusion on an opposite end. The first cavity structure is integrated with the cover, the second cavity structure is integrated with the chassis, and the pair of arms is integrated with the first light guide. When the cover is removably interlocked with the first light guide, the first protrusions of each of the pair of arms are interlocked within the first recess to hold the cover to the first light guide. When the chassis is removably interlocked with the first light guide, the second protrusions of each of the pair of arms are interlocked within the second recess to hold the chassis to the first light guide.

In at least one embodiment of the frame, the at least one fastening assemblage further includes a quick release mechanism having an attached portion and an open end. The attached portion is integrated with the cover, whereby when the cover is removably interlocked with the first light guide, the quick release mechanism encompasses each of the first protrusions and the first recess on an opposite side of each of the first protrusions and the first recess and when the chassis is removably interlocked with the first light guide, the quick release mechanism encompasses each of the second protrusions and the second recess on an opposite side of each of the second protrusions and the second recess.

In at least one embodiment of the frame, the frame further includes a second light guide. The second light guide includes a second light emitting third surface and a second light emitting second surface. The second light guide is assembled to the chassis. The second light emitting second surface is substantially perpendicular to the second light emitting third surface and the second light emitting second surface is substantially parallel to the first light emitting first flat surface. When the chassis is removably interlocked with the first light guide, the second protrusions of each of the pair of arms are interlocked within the second recess to hold the chassis and the second light guide to the first light guide.

BRIEF DESCRIPTION OF DRAWINGS

Unless specified otherwise, the accompanying drawings illustrate aspects of the innovative subject matter described herein. Referring to the drawings, wherein like reference numerals indicate similar parts throughout the several views, several examples of light emitting fans and frames incorporating aspects of the presently disclosed principles are illustrated by way of example, and not by way of limitation.

DETAILED DESCRIPTION

Figure 1A:
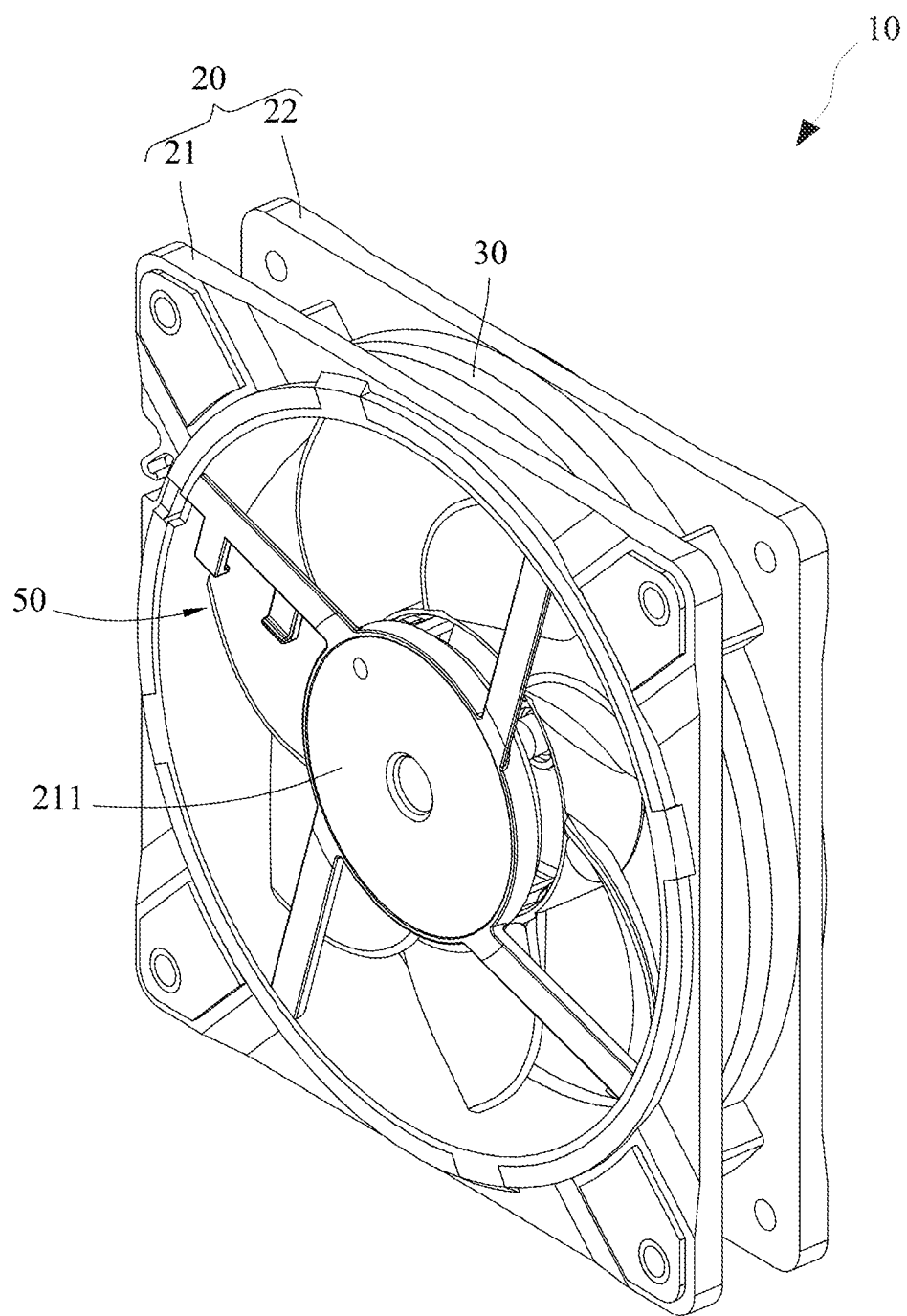
FIG. 1A is a perspective view of a light emitting fan according to one embodiment of the present disclosure.
Figure 1B:
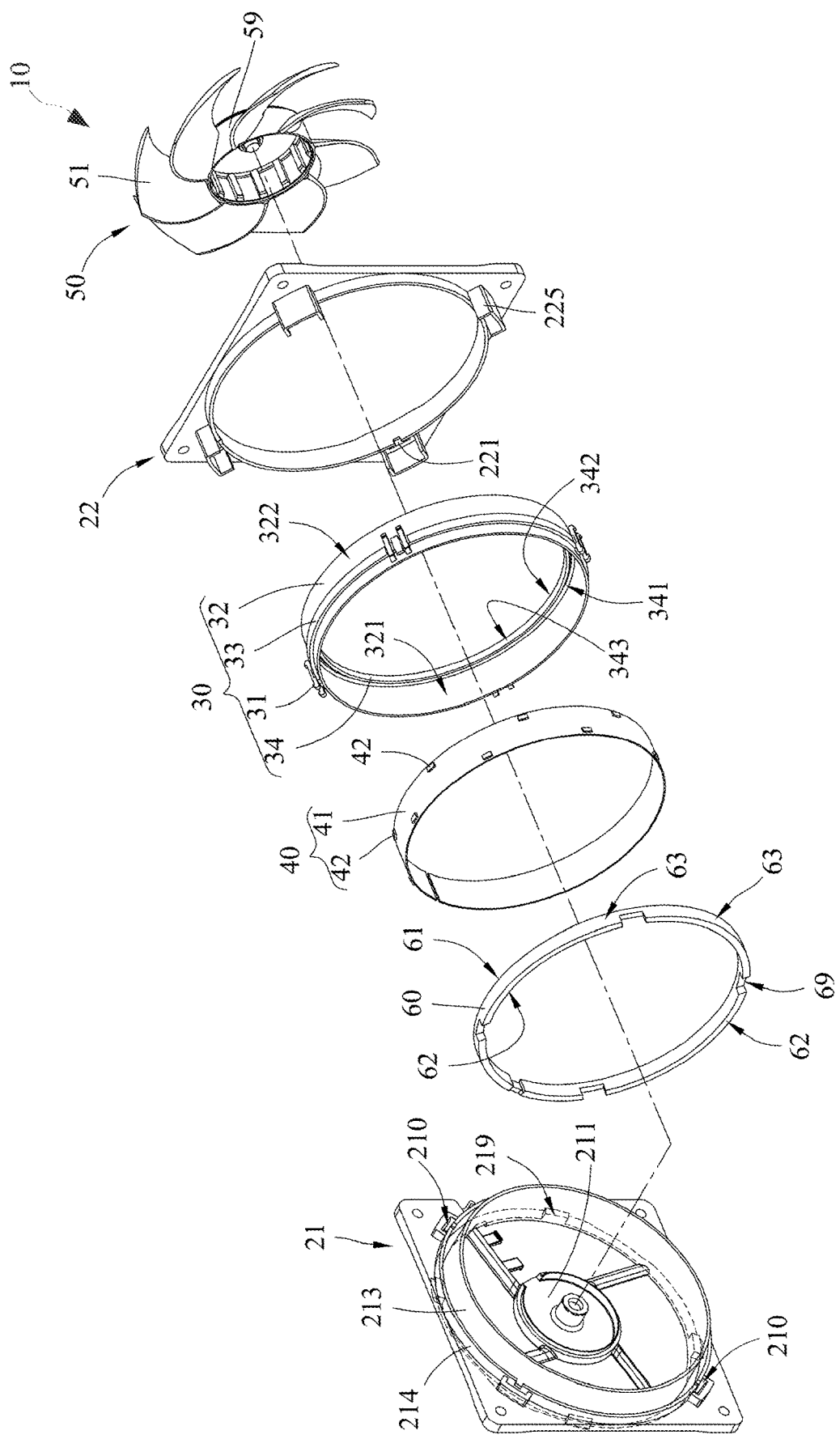
FIG. 1B is an exploded view of the light emitting fan of FIG. 1 according to one embodiment of the present disclosure.
Figure 2A:
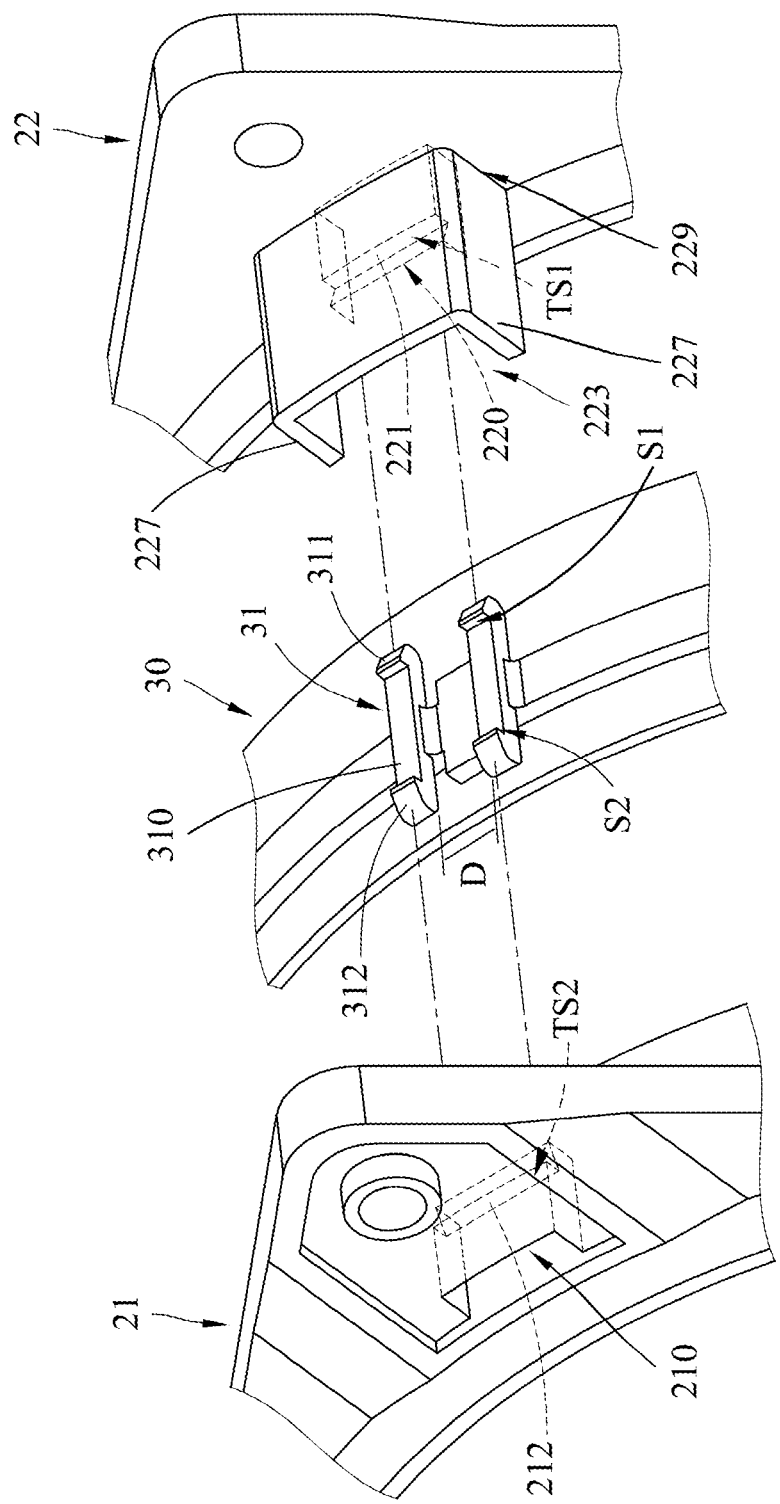
FIG. 2A is a perspective view of a fastening assemblage of the light emitting fan of FIG. 1 according to one embodiment of the present disclosure.
Figure 2B:
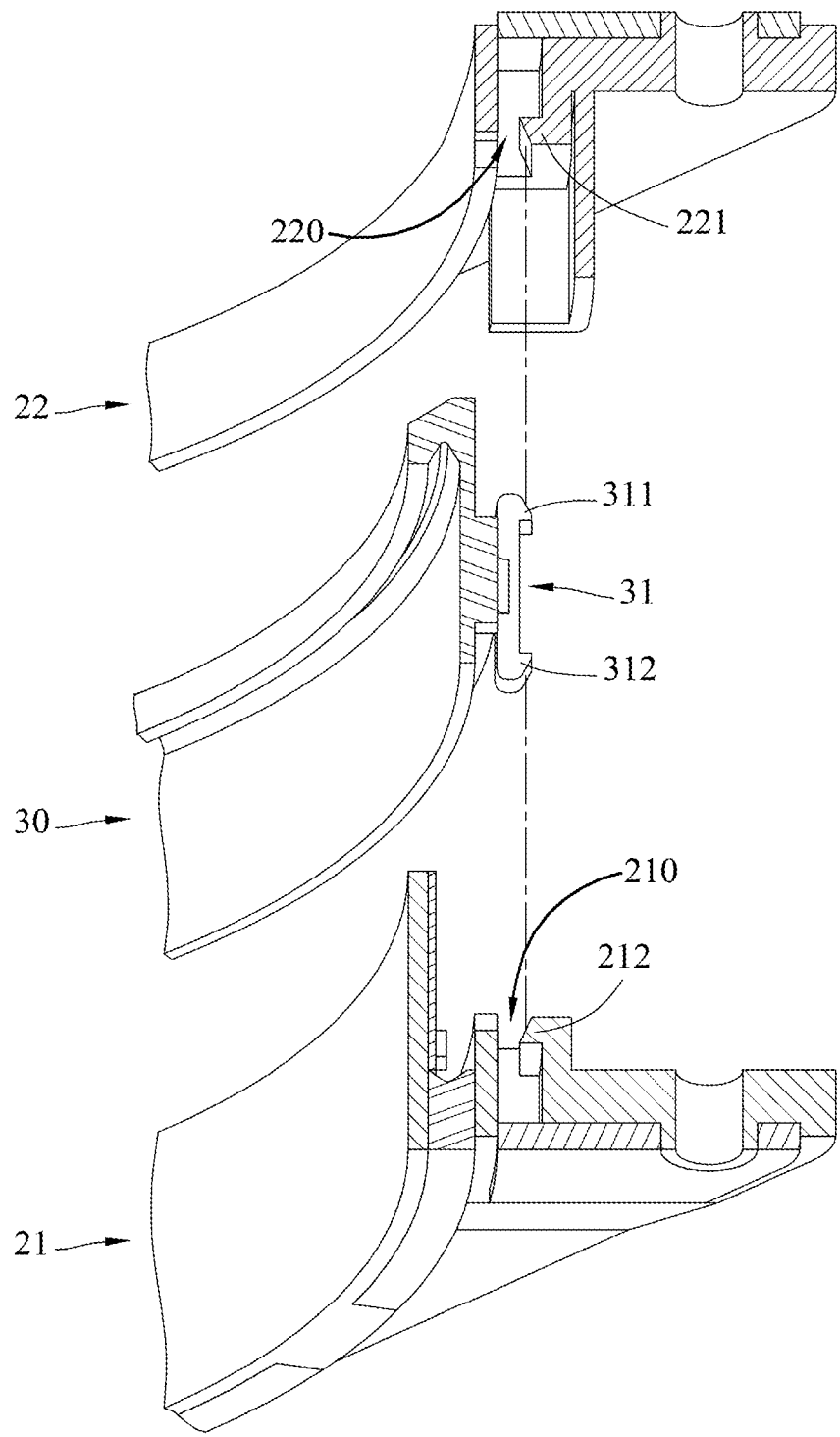
FIG. 2B is a cross-section of the fastening assemblage of FIG. 2A according to one embodiment of the present disclosure.
Figure 3:
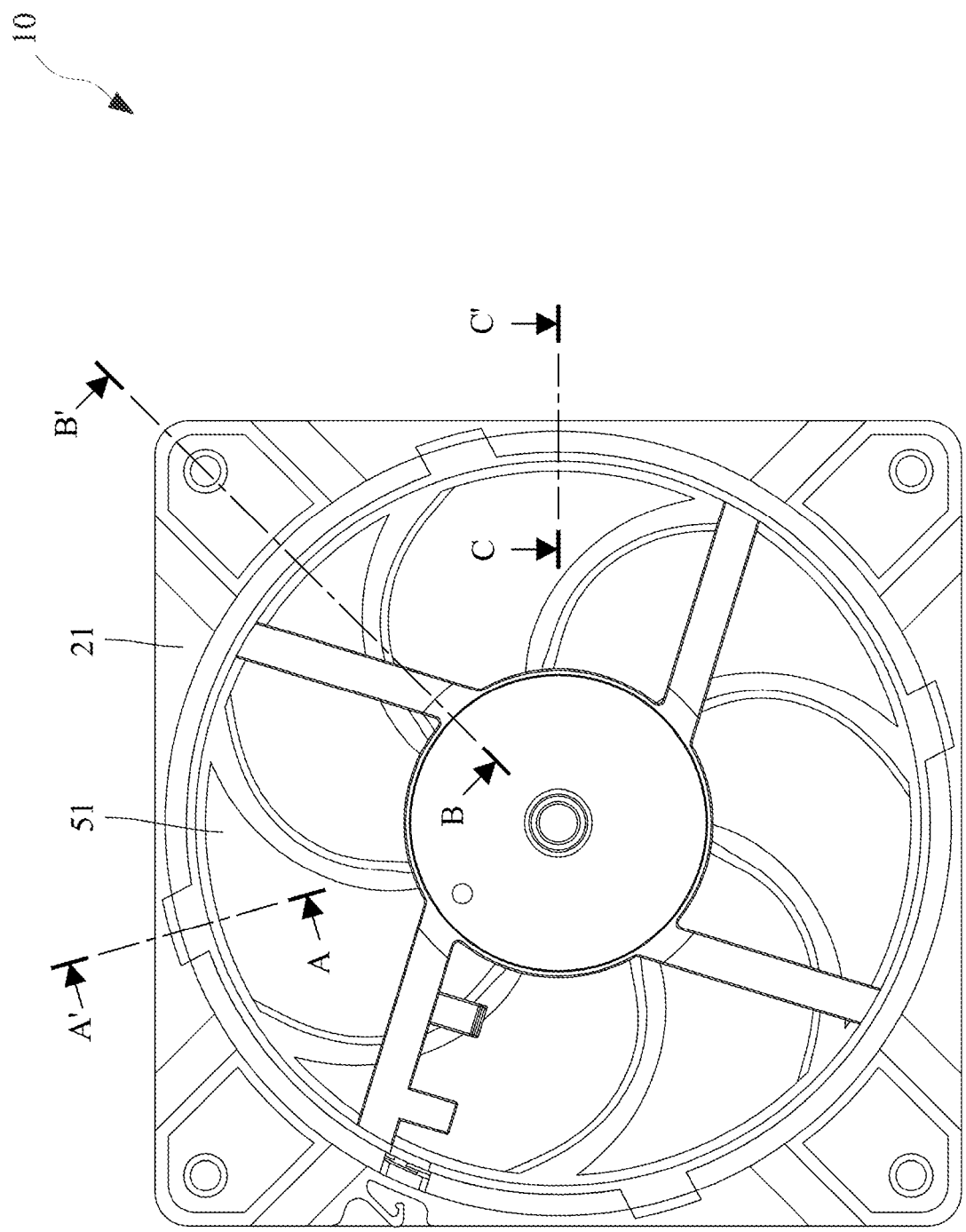
FIG. 3 is another perspective view of the light emitting fan of FIG. 1 according to one embodiment of the present disclosure.
Figure 4:
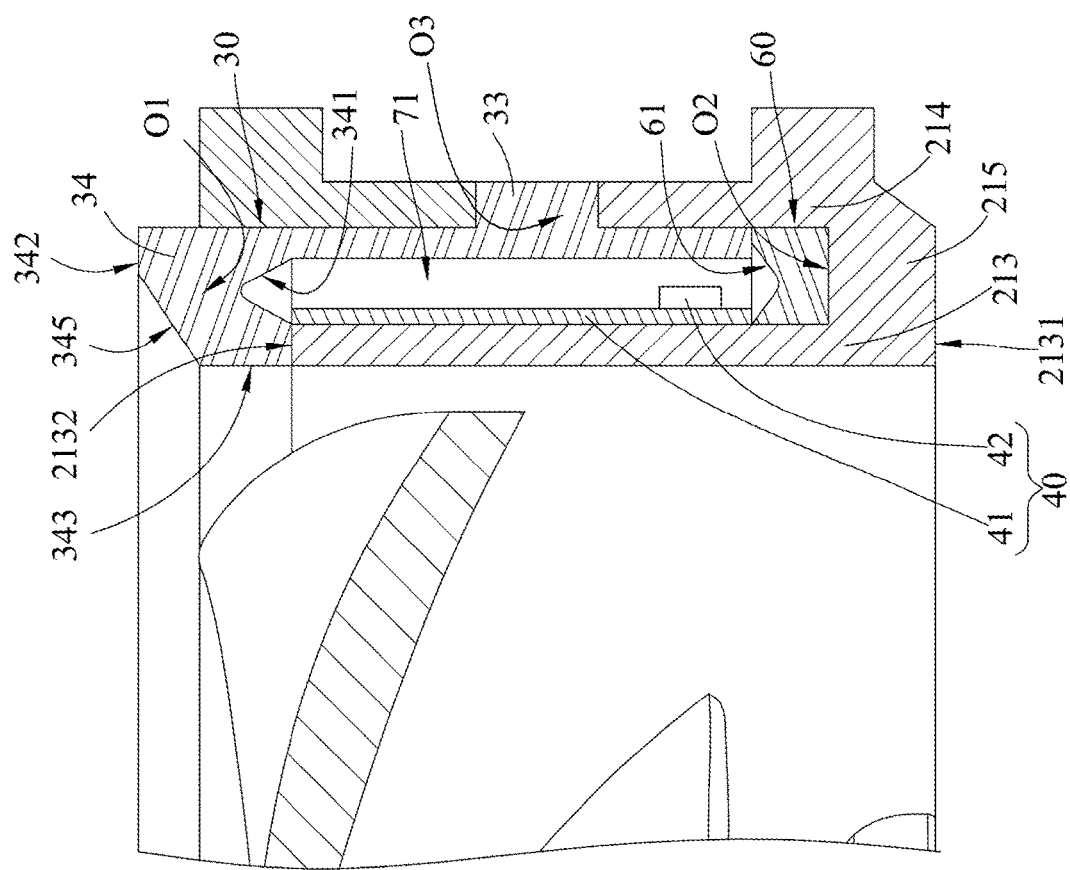
FIG. 4 is a cross-section of the light emitting fan of FIG. 3 taken along the line A-A' according to one embodiment of the present disclosure.

The following describes various principles related to light emitting fans and frames by way of reference to specific examples of light emitting fans and frames, including specific arrangements and examples of light guides and fastening assemblages embodying innovative concepts. More particularly, but not exclusively, such innovative principles are described in relation to selected examples of different light incident angles, different light emitting surface planes, interlocking and unlocking assemblages and methods of interlocking and unlocking assemblages, and well-known functions or constructions are not described in detail for purposes of succinctness and clarity. Nonetheless, one or more of the disclosed principles can be incorporated in various other embodiments of different light incident angles, different light emitting surface planes, interlocking and unlocking assemblages and methods of interlocking and unlocking assemblages to achieve any of a variety of desired outcomes, characteristics, and/or performance criteria.

Thus, light emitting fans and frames having attributes that are different from those specific examples discussed herein can embody one or more of the innovative principles, and can be used in applications not described herein in detail. Accordingly, embodiments of light emitting fans and frames not described herein in detail also fall within the scope of this disclosure, as will be appreciated by those of ordinary skill in the relevant art following a review of this disclosure.

Example embodiments as disclosed herein are directed to electronic systems such as personal computers, wherein temperature is managed and heat is dissipated by cooling fans. The cooling fans can adjust a color, brightness, speed, and mode of LEDs for decorative purposes. The cooling fans can also be connected to sensors that allow the cooling fans to change colors according to a temperature or load of the electronic systems. The cooling fans can furthermore be assembled and disassembled easily and conveniently by use of snap fit joints.

FIGS. 1A-4 include at least one embodiment of a light emitting fan 10. The light emitting fan 10 includes a frame 20, a chassis 21, a plurality of blades 50, a cover 22, and at least one fastening assemblage 220, 210, 31, 225. In at least one embodiment, the frame 20 includes a first light guide 30 and a light source component 40. A shape of the first light guide 30 and light source component 40 can be ring-shaped. The first light guide 30 has a plurality of first light emitting surfaces 342, 345, 33, 343. The light source component 40 is associated with the first light guide 30. The light source component 40 and the first light guide 30 at least partially define a cavity 71. The plurality of blades 50 is rotatably mounted to the chassis 21. The plurality of first light emitting surfaces 342, 345, 33, 343 is in radiant communication with the cavity 71 and planes of each of the plurality of first light emitting surfaces 342, 345, 33, 343 are substantially different. The at least one fastening assemblage 220, 210, 31, 225 removably interlocks the cover 22 with the first light guide 30 and removably interlocks the chassis 21 with the first light guide 30. In at least one embodiment, the at least one fastening assemblage 220, 210, 31, 225 includes four at least one fastening assemblages 220, 210, 31, 225. In at least one embodiment, the at least one fastening assemblage 220, 210, 31, 225 includes three or less at least one fastening assemblages 220, 210, 31, 225. In at least one embodiment, the at least one fastening assemblage 220, 210, 31, 225 includes five or more at least one fastening assemblages 220, 210, 31, 225.

In at least one embodiment, the chassis 21 includes a mounting structure 211 and the plurality of blades 50 includes a hub 59 and blades 51. The mounting structure 211 is centrally within the chassis 21. A shape of the mounting structure 211 corresponds to a shape of the hub 59 and the hub 59 is rotatably mounted on the mounting structure 211. In at least one embodiment, the light source component 40 includes a circuit board 41 and a plurality of light emitting diodes 42. The plurality of light emitting diodes 42 is on and electrically connected to the circuit board 41 and the plurality of light emitting diodes 42 is in communication with the cavity 71. In at least one embodiment, the light source component 40 includes two or more light source components 40.

In at least one embodiment the at least one fastening assemblage 220, 210, 31, 225 includes a first cavity structure 220, a second cavity structure 210, and a pair of arms 31. The first cavity structure 220 has a first recess 221, the second cavity structure 210 has a second recess 212, and each of the pair of arms 31 has a first protrusion on one end and a second protrusion on an opposite end. The first cavity structure 220 is integrated with the cover 22, the second cavity structure 210 is integrated with the chassis 21, and the pair of arms 31 is integrated with the first light guide 30. When the cover 22 is removably interlocked with the first light guide 30, the first protrusions 311 of each of the pair of arms 31 are interlocked within the first recess 221 to hold the cover 22 to the first light guide 30. When the chassis 21 is removably interlocked with the first light guide 30, the second protrusions 312 of each of the pair of arms 31 are interlocked within the second recess 212 to hold the chassis 21 to the first light guide 30. A shape of the pair of arms 31 can be rectangular-shaped and shapes of the first protrusions 311 and second protrusions 312 can be tapered hook-shaped.

In at least one embodiment, the at least one fastening assemblage 220, 210, 31, 225 further includes a quick release mechanism 225 having an attached portion 229 and an open end 223. The attached portion 229 is integrated with the cover 22, whereby when the cover 22 is removably interlocked with the first light guide 30, the quick release mechanism 225 encompasses each of the first protrusions 311 and the first recess 221 on an opposite side of each of the first protrusions 311 and the first recess 221 and when the chassis 21 is removably interlocked with the first light guide 30, the quick release mechanism 225 encompasses each of the second protrusions 312 and the second recess 212 on an opposite side of each of the second protrusions 312 and the second recess 212. In at least one embodiment, the quick release mechanism 225 further has a U-shape plate shape, whereby when a separation force is placed on two opposing sides 227 of the quick release mechanism 225 in an outward and upward direction, the first recess 221 is moved such that each of the first protrusions 311 is unlocked from the first recess 221 to release the cover 22 from the first light guide 30.

In at least one embodiment, the pair of arms 31 is spaced apart by a distance D. When interlocking and unlocking the cover 22 with the first light guide 30, surface areas S1 of each of the first protrusions 311 in contact with the first recess 221 are less than the total available contact surface area TS1 of the first recess 221. When interlocking and locking the chassis 21 with the first light guide 30, surface areas S2 of each of the second protrusions 312 in contact with the second recess 212 are less than the total available contact surface area TS2 of the second recess 212.

Figure 5:
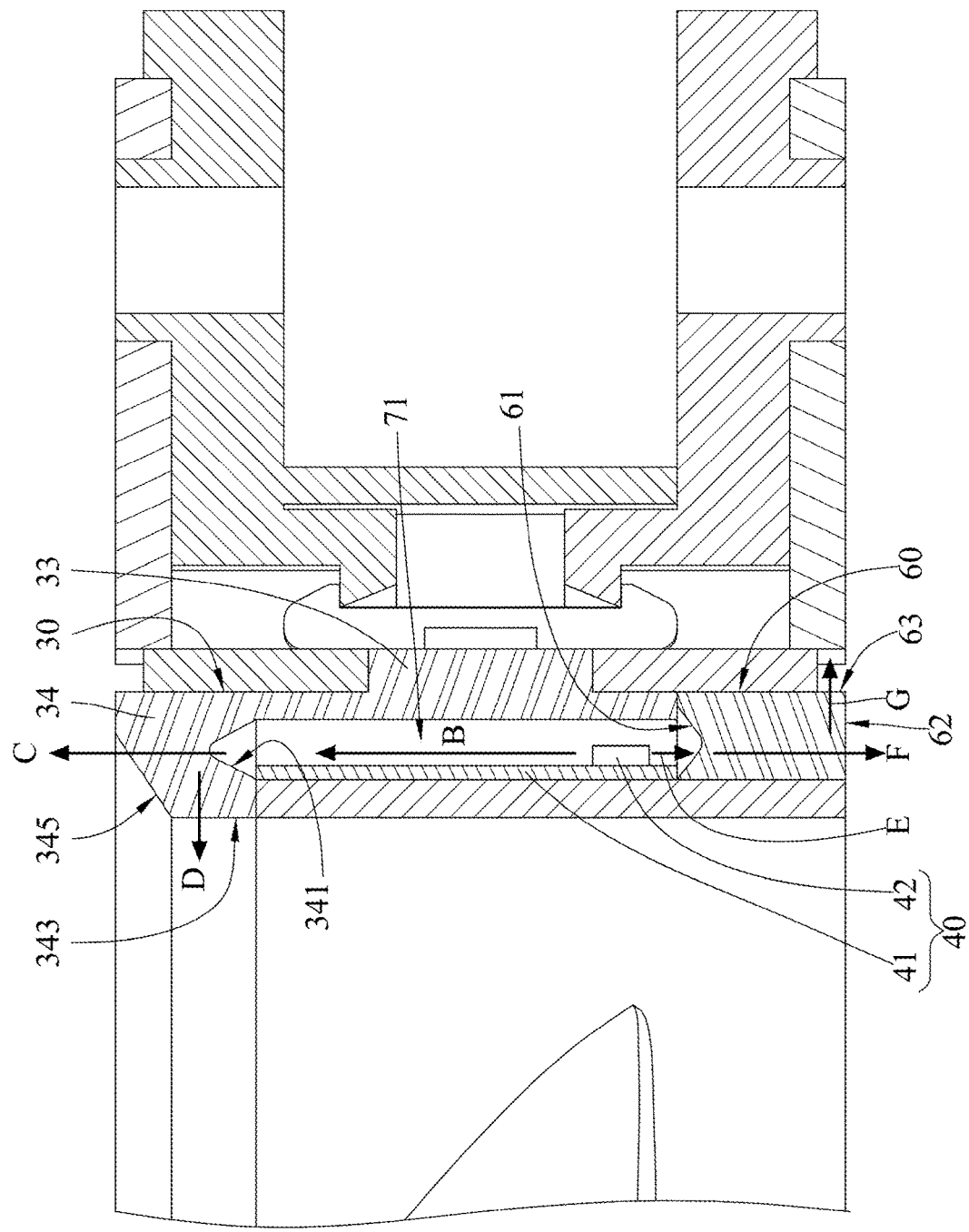
FIG. 5 is a cross-section of the light emitting fan of FIG. 3 taken along the line B-B' according to one embodiment of the present disclosure.
Figure 6:
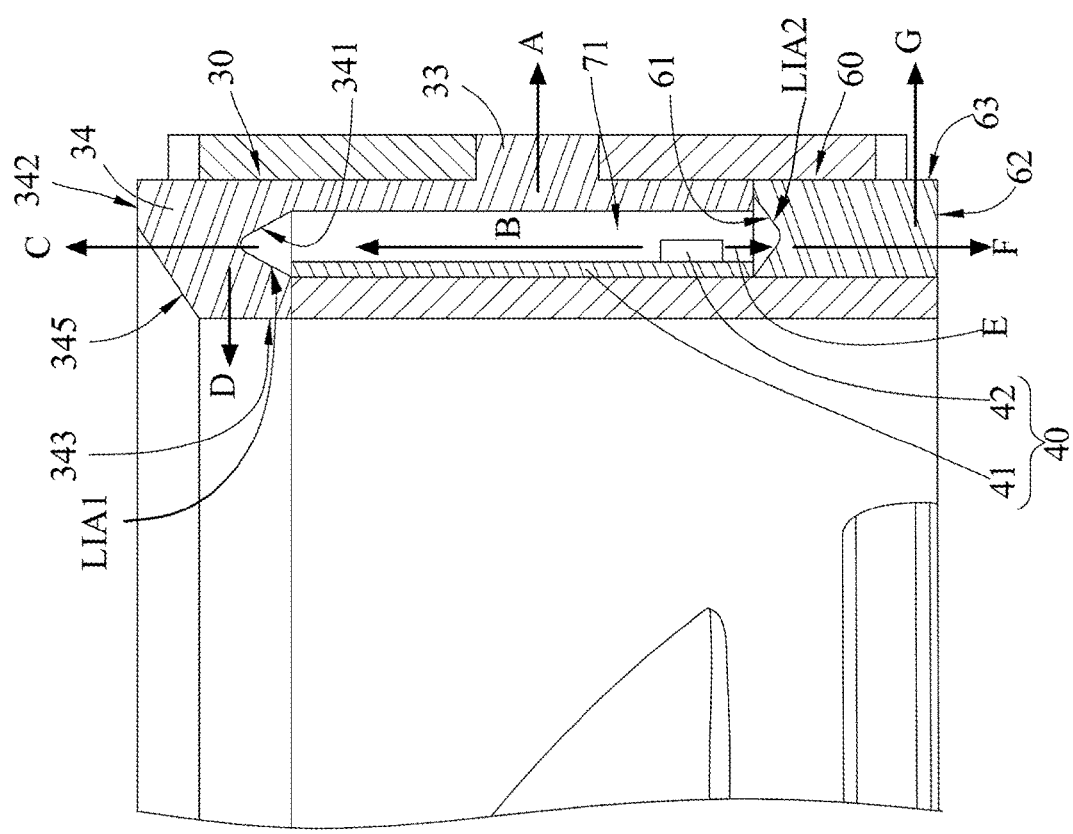
FIG. 6 is a cross-section of the light emitting fan of FIG. 3 taken along the line C-C' according to one embodiment of the present disclosure.

FIGS. 5-6 include at least one embodiment of a light emitting fan 10. The plurality of first light emitting surfaces 342, 345, 33, 343 include a first light emitting first surface 342, 345, a first light emitting third surface 33, and a first light emitting fourth surface 343. The first light emitting fourth surface 343 is substantially parallel to the first light emitting third surface 33 and the first light emitting first surface 342, 345 is between the first light emitting fourth surface 343 and the first light emitting third surface 33. In at least one embodiment the first light emitting first surface 342, 345 includes a first light emitting first flat surface 342 and a first light emitting first angled surface 345. The first light emitting first flat surface 342 is substantially perpendicular to the first light emitting third surface 33 and the first light emitting first angled surface 345 is substantially not perpendicular to the first light emitting third surface 33.

In at least one embodiment, the first light guide 30 further includes a first rim 34 on one end, whereby at least one of the plurality of first light emitting surfaces 342, 345, 33, 343 is defined by the first rim 34. In at least one embodiment, the first rim 34 includes a first grooved end 341 having a plurality of different first light incident angles LIA1. The first grooved end 341 is in communication with the cavity 71, whereby at least one of the plurality of first light emitting surfaces 342, 345, 33, 343 is in radiant communication with the cavity 71 via the plurality of different first light incident angles LIA1. A shape of the first grooved end 341 can be 'V'-shaped from a cross-section view.

In at least one embodiment, the first light guide 30 further includes a first component body 32 having a third body surface 322 and a fourth body surface 321. The fourth body surface 321 is on an opposite side of the third body surface 322. The light source component 40 and the first rim 34 and the fourth body surface 321 of the first light guide 30 at least partially define the cavity 71. In an embodiment, the first light emitting third surface 33 is a protruding surface and the protruding surface protrudes from the third body surface 322.

In at least one embodiment, the at least one of the plurality of first light emitting surfaces 342, 345, 343 of the first rim 34 include the first light emitting first flat surface 342, the first light emitting first angled surface 345, and the first light emitting fourth surface 343. The plurality of light emitting diodes 42 in communication with the cavity 71 at least emits light in an upward and downward direction B to reach the plurality of different first light incident angles LIA1. Light is radiated through the first rim 34 in at least an upward direction C and upper inward direction D to emit light from at least the first light emitting first flat surface 342, the first light emitting first angled surface 345, and the first light emitting fourth surface 343.

In at least one embodiment, the light emitting fan 10 further includes a second light guide 60. A shape of the second light guide 60 can be ring-shaped. The second light guide 60 includes a second light emitting third surface 63 and a second light emitting second surface 62. The second light guide 60 is assembled to the chassis 21 and the light source component 40 is assembled on the second light guide 60. The second light guide 60, the light source component 40 and the first light guide 30 define the cavity 71. The second light emitting third surface 63 and the second light emitting second surface 62 are in radiant communication with the cavity 71. The second light emitting second surface 62 is substantially perpendicular to the second light emitting third surface 63 and the second light emitting second surface 62 is substantially parallel to the first light emitting first flat surface 342. When the chassis 21 is removably interlocked with the first light guide 30, the chassis 21, the second light guide 60, and the light source component 40 are held to the first light guide 30.

In at least one embodiment, the second light guide 60 further includes a second grooved end 61 having a plurality of different second light incident angles LIA2. A shape of the second grooved end 61 can be 'V'-shaped from a cross-section view. The second grooved end 61 is in communication with the cavity 71, whereby the second light emitting third surface 63 and the second light emitting second surface 62 are in radiant communication with the cavity 71 via the plurality of different second light incident angles LIA2. In at least one embodiment, the chassis 21 includes an inner wall 213 and an outer wall 214. The inner wall 213 is substantially parallel to the outer wall 214 and an inner wall height of the inner wall 213 is greater than an outer wall height of the outer wall 214. The second light guide 60 and the light source component 40 are assembled at least partially between the inner wall 213 and the outer wall 214. In at least one embodiment, the chassis 21 further includes a plurality of base structures 215 and the second light guide 60 further includes a plurality of bottom cut-outs 69. The plurality of base structures 215 is connected to and between the inner wall 213 and the outer wall 214. The plurality of bottom cut-outs 69 is substantially opposite the second grooved end 61 and cut-out from the second light emitting second surface 62. A shape of the plurality of bottom cut-outs 69 substantially correspond to a shape of the plurality of base structures 215, whereby the plurality of bottom cut-outs 69 at least partially encompass the plurality of base structures 215.

In at least one embodiment, the inner wall 213 includes an inner wall top end 2132 and an inner wall bottom end 2131. When assembled, at least a portion of the first rim 34 is flush with the inner wall top end 2132 and the plurality of base structures 215 is connected to and between the inner wall bottom end 2131 and a corresponding portion of the outer wall 214.

In at least one embodiment, the plurality of light emitting diodes 42 in communication with the cavity 71 at least emits light in an upward and downward direction B to reach the plurality of different second light incident angles LIA2. Light is radiated through the second light guide 60 in at least a downward direction F and a lower outer direction G to emit light from at least the second light emitting third surface 63 and the second light emitting second surface 62.

In at least one embodiment, light is emitted from first exposed surfaces 01, second exposed surfaces 02, and third exposed surfaces 03 of the light emitting fan 10. The first exposed surfaces 01 are exposed surfaces of the first rim 34, such as the first light emitting first flat surface 342, the first light emitting first angled surface 345, and the first light emitting fourth surface 343. The second exposed surfaces 02 are exposed surfaces of the second light emitting second surface 62 and corresponding surfaces of the second light emitting third surface 63 not substantially corresponding to the plurality of base structures 215. The third exposed surfaces 03 are exposed surfaces of the first light emitting third surface 33 at least between the at least one fastening assemblage 220, 210, 31, 225.

In at least one embodiment, a frame includes a first light guide 30, a chassis 21, a cover 22 and at least one fastening assemblage 220, 210, 31, 225. The frame may be similar in some respects to the frame 20 of FIGS. 1A-6, and therefore may be best understood with reference thereto where like numerals designate like components not described again in detail. The first light guide 30 has a plurality of first light emitting surfaces 342, 345, 33, 343. The at least one fastening assemblage 220, 210, 31, 225 removably interlocks the cover 22 with the first light guide 30 and removably interlocks the chassis 21 with the first light guide 30 substantially opposite the cover 22.

The at least one fastening assemblage 220, 210, 31, 225 of the frame includes a first cavity structure 220, a second cavity structure 210, and a pair of arms 31. The first cavity structure 220 has a first recess 221, the second cavity structure 210 has a second recess 212, and each of the pair of arms 31 has a first protrusion on one end and a second protrusion on an opposite end. The first cavity structure 220 is integrated with the cover 22, the second cavity structure 210 is integrated with the chassis 21, and the pair of arms 31 is integrated with the first light guide 30. When the cover 22 is removably interlocked with the first light guide 30, the first protrusions 311 of each of the pair of arms 31 are interlocked within the first recess 221 to hold the cover 22 to the first light guide 30. When the chassis 21 is removably interlocked with the first light guide 30, the second protrusions 312 of each of the pair of arms 31 are interlocked within the second recess 212 to hold the chassis 21 to the first light guide 30.

In at least one embodiment of the frame, the at least one fastening assemblage 220, 210, 31, 225 further includes a quick release mechanism 225 having an attached portion 229 and an open end 223. The attached portion 229 is integrated with the cover 22, whereby when the cover 22 is removably interlocked with the first light guide 30, the quick release mechanism 225 encompasses each of the first protrusions 311 and the first recess 221 on an opposite side of each of the first protrusions 311 and the first recess 221 and when the chassis 21 is removably interlocked with the first light guide 30, the quick release mechanism 225 encompasses each of the second protrusions 312 and the second recess 212 on an opposite side of each of the second protrusions 312 and the second recess 212.

In at least one embodiment of the frame, the frame further includes a second light guide 60. The second light guide 60 includes a second light emitting third surface 63 and a second light emitting second surface 62. The second light guide 60 is assembled to the chassis 21. The second light emitting second surface 62 is substantially perpendicular to the second light emitting third surface 63 and the second light emitting second surface 62 is substantially parallel to the first light emitting first flat surface 342. When the chassis 21 is removably interlocked with the first light guide 30, the second protrusions 312 of each of the pair of arms 31 are interlocked within the second recess 212 to hold the chassis 21 and the second light guide 60 to the first light guide 30.

In at least one embodiment for assembly of the light emitting fan 10, the hub 59 of the plurality of blades 50 is rotatably mounted on the mounting structure 211. The cover 22 is interlocked with the first light guide 30 as the first protrusions 311 of each of the pair of arms 31 are snap-fit into the first recess 221 and interlocked therewithin. More specifically, the pair of arms 31 are deformed, bending backward toward the first light guide 30, as the first protrusions 311 enter the first cavity structure 220 to reach the first recess 221. When reaching the first recess 221, the first protrusions 311 snap back as the pair of arms 31 return to its original shape, interlocking the first protrusions 311 in the first recess 221. The second light guide 60 is assembled to the chassis 21 by fitting the plurality of bottom cut-out to the plurality of base structures 215. The light source component 40 is assembled on the second light guide 60. The chassis 21 having the assembled second light guide 60 and light source component 40 is interlocked with the first light guide 30 as the second protrusions 312 of each of the pair of arms 31 are snap-fit into the second recess 212 and interlocked within the second recess 212. More specifically, the pair of arms 31 are deformed, bending backward toward the first light guide 30, as the second protrusions 312 enter the second cavity structure 210 to reach the second recess 212. When reaching the second recess 212, the second protrusions 312 snap back as the pair of arms 31 returns to its original shape, interlocking the second protrusions 312 in the second recess 212.

In at least one embodiment for disassembly of the light emitting fan 10, the hub 59 of the plurality of blades 50 can be removed from the mounting structure 211. The cover 22 can be unlocked from the first light guide 30 by providing an outward and upward separation force on two opposing sides 227 of the quick release mechanism 225 away from the cover 22, deforming the quick release mechanism 225 and allowing the first protrusions 311 to slide out and be released from the first recess 221. From there, the first light guide 30 can be more easily unlocked from the chassis 21 to release the chassis 21, the second light guide 60, and the light source component 40 from the first light guide 30.

The light emitting fans 10 of the present disclosure provide a variety of different light combinations during operation of the light emitting fans 10 for aesthetic, decorative, and informational purposes. Planes of each of the plurality of first light emitting surfaces 342, 345, 33, 343 and planes of each of the plurality of second light emitting surfaces 63, 62 (second light emitting third surface 63 and a second light emitting second surface 62) are substantially different. The first grooved end 341 of the first rim 34 of the first light guide 30 having the plurality of different first light incident angles LIA1 and the second grooved end 61 of the second light guide 60 having the plurality of different second light incident angles LIA2, both, being in communication with the cavity 71 and in radiant communication with the plurality of first light emitting surfaces 342, 345, 33, 343 and the plurality of second light emitting surfaces 63, 62, contribute directly to beam spread of at least the plurality of first light emitting surfaces 342, 345, 343 and the plurality of second light emitting surfaces 63, 62, thus, maximizing light intensity and enhancing light combinations for the light emitting fans 10. The present disclosure also provides an easy, fast and convenient means for assembly and disassembly of the light emitting fans 10. The at least one fastening assemblage 220, 210, 31, 225 removably interlocks the cover 22 with the first light guide 30 and removably interlocks the chassis 21, second light guide 60, and light source component 40 with the first light guide 30. After the hub 59 of the plurality of blades 50 is rotatably mounted on the mounting structure 211, only one pressing force is needed to interlock the cover 22 to the first light guide 30 and only one pressing force is needed to interlock the chassis 21 to the first light guide 30 to complete assembly of the light emitting fans 10. The pair of arms 31, each of the first protrusions 311 and the first recess 221, and each of the second protrusions 312 and the second recess 212 are encompassed by the quick release mechanism 225. Thus, the pair of arms 31, the first and second protrusions 312 and the first and second recesses 221, 212 are protected from outer environmental conditions, such as high temperatures, chemical exposure, humidity etc., hindering deterioration and extending service life, which in turn insures interlocking and unlocking reliability of the at least one fastening assemblage 220, 210, 31, 225. The U-shape plate shape of the quick release mechanism 225 allows a separation force to be placed on two opposing sides 227 of the quick release mechanism 225 to quickly release the cover 22 from the first light guide 30. Thereafter, the first light guide 30 can be more easily unlocked from the chassis 21 to release the chassis 21 from the first light guide 30. The distance D between the pair of arms 31 allows the area of attachment of the at least one fastening assemblage 220, 210, 31, 225 to be greater than if there was no distance D, increasing attachment force and minimizing the number of at least one fastening assemblages 220, 210, 31, 225 needed. The distance D between the pair of arms 31 also allows the surface areas S1 of each of the first protrusions 311 in contact with the first recess 221 and of each of the second protrusions 312 in contact with the second recess 212 to be less than the total available contact surface areas TS1, TS2 of the first recess 221 and second recess 212. Thus, making interlocking and locking of the cover 22 with the first light guide 30 and of the chassis 21 with the first light guide 30, easier, without the need for tools, special equipment or multiple steps for assembly, maintenance, repair, or replacement of components.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some number. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A light emitting fan, comprising:
a first light guide having a plurality of first light emitting surfaces,
a light source component associated with the first light guide, the light source component and the first light guide at least partially define a cavity,
a chassis,
a plurality of blades, the plurality of blades rotatably mounted to the chassis,
a cover, and
at least one fastening assemblage,
wherein the plurality of first light emitting surfaces is in radiant communication with the cavity and planes of each of the plurality of first light emitting surfaces are different,
wherein the at least one fastening assemblage is configured to removably interlocks the cover with the first light guide and removably interlocks the chassis with the first light guide,
wherein the first light guide further comprises a first rim on one end, whereby at least one of the first light emitting surfaces is defined by the first rim, and
wherein the first rim comprises a first grooved end having a plurality of different first light incident angles, the first grooved end is in communication with the cavity, whereby at least one of the first light emitting surfaces is in radiant communication with the cavity via the plurality of different first light incident angles.

2. The light emitting fan of claim 1, wherein the plurality of first light emitting surfaces comprise a first light emitting first surface, a first light emitting third surface, and a first light emitting fourth surface, the first light emitting fourth surface is parallel to the first light emitting third surface and the first light emitting first surface is between the first light emitting fourth surface and the first light emitting third surface.

3. The light emitting fan of claim 2, wherein the first light emitting first surface comprises a first light emitting first flat surface and a first light emitting first angled surface, the first light emitting first flat surface is perpendicular to the first light emitting third surface, and the first light emitting first angled surface is not perpendicular to the first light emitting third surface.

4. The light emitting fan of claim 1, wherein the at least one fastening assemblage comprises a first cavity structure, a second cavity structure, and a pair of arms, the first cavity structure has a first recess, the second cavity structure has a second recess, and each of the pair of arms has a first protrusion on one end and a second protrusion on an opposite end, the first cavity structure is integrated with the cover, the second cavity structure is integrated with the chassis, and the pair of arms is integrated with the first light guide, whereby when the cover is removably interlocked with the first light guide, the first protrusions of each of the pair of arms are interlocked within the first recess to hold the cover to the first light guide, and when the chassis is removably interlocked with the first light guide, the second protrusions of each of the pair of arms are interlocked within the second recess to hold the chassis and the light source component to the first light guide.

5. The light emitting fan of claim 4, wherein the at least one fastening assemblage further comprises a quick release mechanism, the quick release mechanism includes an attached portion and an open end, the attached portion is integrated with the cover, whereby when the cover is removably interlocked with the first light guide, the quick release mechanism encompasses each of the first protrusions and the first recess on an corresponding side of each of the first protrusions and the first recess and when the chassis is removably interlocked with the first light guide, the quick release mechanism encompasses each of the second protrusions and the second recess on an corresponding side of each of the second protrusions and the second recess.

6. The light emitting fan of claim 5, wherein the quick release mechanism further has a U-shape plate shape, whereby when a separation force is placed on two opposing sides of the quick release mechanism in an outward and upward direction, each of the first protrusions is unlocked from the first recess to release the cover from the first light guide.

7. The light emitting fan of claim 6, wherein the pair of arms is spaced apart by a distance, whereby when interlocking and unlocking the cover with the first light guide, surface areas of each of the first protrusions in contact with the first recess are less than the total available contact surface area of the first recess, and when interlocking and locking the chassis with the first light guide, surface areas of each of the second protrusions in contact with the second recess are less than the total available contact surface area of the second recess.

8. The light emitting fan of claim 4, further comprising:
a second light guide comprising a second light emitting third surface and a second light emitting second surface, the second light guide is assembled to the chassis, the light source component is assembled on the second light guide, the second light guide, the light source component and the first light guide define the cavity, the second light emitting third surface and the second light emitting second surface are in radiant communication with the cavity, the second light emitting second surface is perpendicular to the second light emitting third surface, the second light emitting second surface is parallel to a first light emitting first flat surface, whereby when the chassis is removably interlocked with the first light guide, the chassis, the second light guide, and the light source component are held to the first light guide.

9. The light emitting fan of claim 8, wherein the second light guide further comprises a second grooved end having a plurality of different second light incident angles, the second grooved end is in communication with the cavity, whereby the second light emitting third surface and the second light emitting second surface are in radiant communication with the cavity via the plurality of different second light incident angles.

10. The light emitting fan of claim 9, wherein the chassis comprises an inner wall and an outer wall, the inner wall is parallel to the outer wall and an inner wall height of the inner wall is greater than an outer wall height of the outer wall, the second light guide and the light source component are assembled at least partially between the inner wall and the outer wall.

11. The light emitting fan of claim 10, wherein the chassis further comprises a plurality of base structures and the second light guide further comprises a plurality of bottom cut-outs, the plurality of base structures is connected to and between the inner wall and the outer wall, the plurality of bottom cut-outs is opposite the second grooved end, a shape of the plurality of bottom cut-outs correspond to a shape of the plurality of base structures, whereby the plurality of bottom cut-outs at least partially encompass the plurality of base structures.

12. The light emitting fan of claim 1, wherein the chassis comprises a mounting structure and the plurality of blades comprises a hub and blades, the mounting structure is centrally within the chassis, a shape of the mounting structure corresponds to a shape of the hub, whereby the hub is rotatably mounted on the mounting structure.

13. The light emitting fan of claim 1, wherein the light source component comprises a circuit board and a plurality of light emitting diodes, the plurality of light emitting diodes is on and electrically connected to the circuit board, whereby the plurality of light emitting diodes is in communication with the cavity.

14. The light emitting fan of claim 1, wherein the at least one fastening assemblage comprises four fastening assemblages.

15. A frame, comprising:
a first light guide having a plurality of first light emitting surfaces, the first light guide at least partially defines a cavity,
a chassis,
a cover, and
at least one fastening assemblage,
wherein the at least one fastening assemblage is configured to removably interlocks the cover with the first light guide and removably interlocks the chassis with the first light guide opposite the cover,
wherein the first light guide further comprises a first rim on one end, whereby at least one of the first light emitting surfaces is defined by the first rim, and
wherein the first rim comprises a first grooved end having a plurality of different first light incident angles, the first grooved end is in communication with the cavity, whereby at least one of the first light emitting surfaces is in radiant communication with the cavity via the plurality of different first light incident angles.

16. The frame of claim 15, wherein the at least one fastening assemblage comprises a first cavity structure, a second cavity structure, and a pair of arms, the first cavity structure has a first recess, the second cavity structure has a second recess, and each of the pair of arms has a first protrusion on one end and a second protrusion on an opposite end, the first cavity structure is integrated with the cover, the second cavity structure is integrated with the chassis, and the pair of arms is integrated with the first light guide, whereby when the cover is removably interlocked with the first light guide, the first protrusions of each of the pair of arms are interlocked within the first recess to hold the cover to the first light guide, and when the chassis is removably interlocked with the first light guide, the second protrusions of each of the pair of arms are interlocked within the second recess to hold the chassis to the first light guide.

17. The frame of claim 16, wherein the at least one fastening assemblage further comprises a quick release mechanism having an attached portion and an open end, the attached portion is integrated with the cover, whereby when the cover is removably interlocked with the first light guide, the quick release mechanism encompasses each of the first protrusions and the first recess on an corresponding side of each of the first protrusions and the first recess and when the chassis is removably interlocked with the first light guide, the quick release mechanism encompasses each of the second protrusions and the second recess on an corresponding side of each of the second protrusions and the second recess.

18. The frame of claim 16, further comprising:
a second light guide comprising a second light emitting third surface and a second light emitting second surface, the second light guide is assembled to the chassis, the second light emitting second surface is perpendicular to the second light emitting third surface, the second light emitting second surface is parallel to a first light emitting first flat surface, whereby when the chassis is removably interlocked with the first light guide, the second protrusions of each of the pair of arms are interlocked within the second recess to hold the chassis and the second light guide to the first light guide.

* * * * *